United States Patent
Kim et al.

(10) Patent No.: US 10,855,247 B2
(45) Date of Patent: Dec. 1, 2020

(54) ELLIPTICAL STRUCTURE FOR BULK ACOUSTIC WAVE RESONATOR

(71) Applicant: Akoustis, Inc., Huntersville, NC (US)

(72) Inventors: Dae Ho Kim, Cornelius, NC (US);
Pinal Patel, Charlotte, NC (US);
Rohan W. Houlden, Oak Ridge, NC (US); James Blanton Shealy, Ithaca, NY (US); Jeffrey B. Shealy, Cornelius, NC (US)

(73) Assignee: AKOUSTIS, INC., Huntersville, NC (US)

(*) Notice: Subject to any disclaimer, the term of this patent is extended or adjusted under 35 U.S.C. 154(b) by 1 day.

(21) Appl. No.: 16/054,929

(22) Filed: Aug. 3, 2018

(65) Prior Publication Data

US 2019/0044493 A1 Feb. 7, 2019

Related U.S. Application Data (60) Provisional application No. 62/541,028, filed on Aug. 3, 2017.

(51) Int. Cl.
*H03H 9/02* (2006.01)
*H03H 9/13* (2006.01)
(Continued)

(52) U.S. Cl.
CPC .... *H03H 9/02157* (2013.01); *H03H 9/02118* (2013.01); *H03H 9/131* (2013.01);
(Continued)

(58) Field of Classification Search
CPC ........... H03H 9/02118; H03H 9/02157; H03H 9/02102; H03H 9/131; H03H 9/132;
(Continued)

(56) References Cited

U.S. PATENT DOCUMENTS 5,714,917 A * 2/1998 Ella .................... H03C 1/46
310/318
5,910,756 A * 6/1999 Ella .................... H03H 9/0095
310/322
(Continued)

FOREIGN PATENT DOCUMENTS

DE 10 2006 032 950 * 1/2008
JP 2005184303 A 7/2005

OTHER PUBLICATIONS

International Search Report and Written Opinion for PCT/US2018/045064 filed Aug. 2, 2018.
(Continued)

*Primary Examiner* — Barbara Summons
(74) *Attorney, Agent, or Firm* — Richard T. Ogawa; Ogawa P.C.

(57) ABSTRACT

An elliptical-shaped resonator device. The device includes a bottom metal plate, a piezoelectric layer overlying the bottom metal plate, and a top metal plate overlying the piezoelectric layer. The top metal plate, the piezoelectric layer, and the bottom metal plate are characterized by an elliptical shape having a horizontal diameter (dx) and a vertical diameter (dy), which can be represented as ellipse ratio R=dx/dy. Using the elliptical structure, the resulting bulk acoustic wave resonator (BAWR) can exhibit equivalent or improved insertion loss, higher coupling coefficient, and higher quality factor compared to conventional polygon-shaped resonators.

5 Claims, 10 Drawing Sheets

(51) Int. Cl.
*H03H 9/17* (2006.01)
*H03H 9/56* (2006.01)

(52) U.S. Cl.
CPC ............ *H03H 9/132* (2013.01); *H03H 9/172* (2013.01); *H03H 9/568* (2013.01)

(58) Field of Classification Search
CPC ........ H03H 9/172; H03H 9/173; H03H 9/174; H03H 9/562; H03H 9/564; H03H 9/566; H03H 9/568; H03H 9/581; H03H 9/582; H03H 9/587; H03H 9/588; H03H 9/589; H03H 9/60; H03H 9/605
USPC .................................................. 333/187, 189
See application file for complete search history.

(56) References Cited

U.S. PATENT DOCUMENTS

| | | | | |
|---|---|---|---|---|
| 6,653,913 B2 * | 11/2003 | Klee | ......................... | H03H 3/04 333/188 |
| 2002/0093394 A1 * | 7/2002 | Tikka | ................... | H03H 9/0095 333/133 |
| 2005/0099094 A1 * | 5/2005 | Nishihara | .......... | H03H 9/02133 310/324 |
| 2005/0140468 A1 * | 6/2005 | Wang | ....................... | H03H 3/02 333/191 |
| 2005/0218755 A1 * | 10/2005 | Song | ........................ | H03H 3/02 310/348 |
| 2006/0244553 A1 | 11/2006 | Yokoyama et al. | | |
| 2007/0252662 A1 | 11/2007 | Nishihara et al. | | |
| 2008/0258842 A1 * | 10/2008 | Ruby | ....................... | H03H 3/02 333/187 |
| 2009/0079302 A1 * | 3/2009 | Wall | ........................ | H03H 9/132 310/365 |
| 2010/0109809 A1 * | 5/2010 | Tanaka | ................... | H03H 9/132 333/187 |
| 2010/0148888 A1 * | 6/2010 | Hara | ....................... | H03H 9/132 333/133 |
| 2010/0156565 A1 | 6/2010 | Oka et al. | | |
| 2012/0229223 A1 | 9/2012 | Ii et al. | | |
| 2014/0070671 A1 * | 3/2014 | Park | ....................... | H01L 41/047 310/365 |
| 2016/0190426 A1 | 6/2016 | Kobayashi | | |
| 2017/0019085 A1 * | 1/2017 | Kida | ....................... | H03H 9/205 |
| 2017/0264264 A1 * | 9/2017 | Huang | ................... | H01L 27/20 |
| 2018/0109237 A1 * | 4/2018 | Wasilik | ................ | H03H 9/105 |
| 2019/0044493 A1 | 2/2019 | Kim et al. | | |
| 2019/0089332 A1 | 3/2019 | Menendez-Nadal et al. | | |

OTHER PUBLICATIONS

International Search Report and Written Opinion for PCT/US2020/028292 filed Jul. 24, 2020.

* cited by examiner

ELLIPTICAL STRUCTURE FOR BULK ACOUSTIC WAVE RESONATOR

CROSS-REFERENCES TO RELATED APPLICATIONS

The present application claims priority to, and incorporates by reference, for all purposes, the following provisional patent application: U.S. Prov. App. No. 62/541,028 titled "ELLIPTICAL RESONATOR", filed Aug. 3, 2017.

BACKGROUND OF THE INVENTION

The present invention relates generally to electronic devices and more particularly to resonators based on piezoelectric epitaxial films and essentially single crystal films.

Mobile telecommunication devices have been successfully deployed world-wide. Over a billion mobile devices, including cell phones and smartphones, were manufactured in a single year and unit volume continues to increase year-over-year. With ramp of 4G/LTE in about 2012, and explosion of mobile data traffic, data rich content is driving the growth of the smartphone segment—which is expected to reach 2B per annum within the next few years. Coexistence of new and legacy standards and thirst for higher data rate requirements is driving RF complexity in smartphones. Unfortunately, limitations exist with conventional RF technology that is problematic, and may lead to drawbacks in the future.

From the above, it is seen that techniques for improving electronic devices are highly desirable.

BRIEF SUMMARY OF THE INVENTION

The present invention relates generally to electronic devices and more particularly to resonators based on piezoelectric epitaxial films and essentially single crystal films.

In an example, the present invention provides an elliptical-shaped resonator device. The device includes a bottom metal plate, a piezoelectric layer overlying the bottom metal plate, and a top metal plate overlying the piezoelectric layer. The top metal plate, the piezoelectric layer, and the bottom metal plate are characterized by an elliptical shape having a horizontal diameter (dx) and a vertical diameter (dy), which can be represented as ellipse ratio R=dx/dy. In a specific example, the ellipse ratio R ranges from about 1.20 to about 2.00.

A plurality of these elliptical-shaped resonator devices can be configured within an RF filter circuit device. A plurality of micro-vias can be configured to coupled certain resonators to each other or couple a resonator to an interconnect metal or bond pad. In a specific example, the present invention provides an RF filter configuration using 11 elliptical-shaped resonator devices, with seven such resonators coupled in series and four such resonators coupled between junctions of the resonator series chain and ground. Those of ordinary skill in the art will recognize other variations, modifications, and alternatives.

One or more benefits are achieved over pre-existing techniques using the invention. In particular, the present device can be manufactured in a relatively simple and cost effective manner while using conventional materials and/or methods according to one of ordinary skill in the art. Using the present method, one can create an improved bulk acoustic wave resonator (BAWR) having equivalent or improved insertion loss compared to conventional polygon-shaped resonators. Such filters or resonators can be implemented in an RF filter device, an RF filter system, or the like. Depending upon the embodiment, one or more of these benefits may be achieved. Of course, there can be other variations, modifications, and alternatives.

A greater understanding of the nature and advantages of the invention may be realized by reference to the latter portions of the specification and attached drawings.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE INVENTION

The present invention relates generally to electronic devices and more particularly to resonators based on piezoelectric epitaxial films and essentially single crystal films.

Generally, a Bulk Acoustic Wave Resonator (BAWR) is a parallel plate capacitor which can be characterized by the geometrical shape of its metal plates and the thickness and composition of the piezoelectric material between the two electrodes of the capacitor. A configuration of such resonators can be used to create an RF filter creating a signal passband that is characterized by the insertion loss (known as "S21"), which describes the impact of placing the filter in an RF circuit.

Conventional resonators are typically constructed using polygons with N-number of sides (where N≥3). Circular-shaped resonators are possible, but typically offer undesirable symmetry, which leads to undesirable modes in the resonator. However, elliptical-shaped resonators can be constructed with a ratio, defined as R, of the horizontal diameter (dx) to vertical diameter (dy) of the resonator, where R=dx/dy. Once defined with R, the resonator can be placed in an RF circuit at an arbitrary angle theta (θ).

According to examples of the present invention, single-crystal piezoelectric-based RF filters using ellipse-shaped resonators with the unique ratio of R between about 1.60 and about 1.61 have been fabricated and tested to provide equivalent or improved insertion loss performance when compared to conventional polygon-shaped resonators. Such filters are characterized by a center frequency ranging from about 0.4 GHz to about 20 GHz and use one or more areas to adjust the electrical impedance of the filter circuit.

Figure 1A:
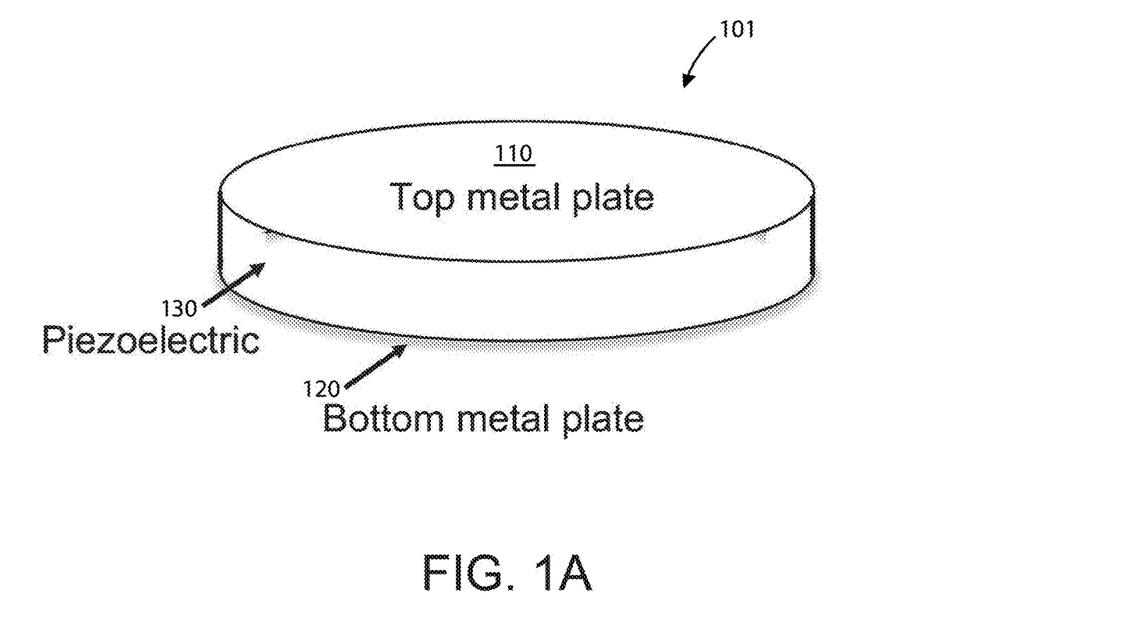
FIGS. 1A and 1B are simplified diagrams illustrating a side view and top view, respectively, for an elliptical-shaped resonator device according to an example of the present invention.
Figure 1B:
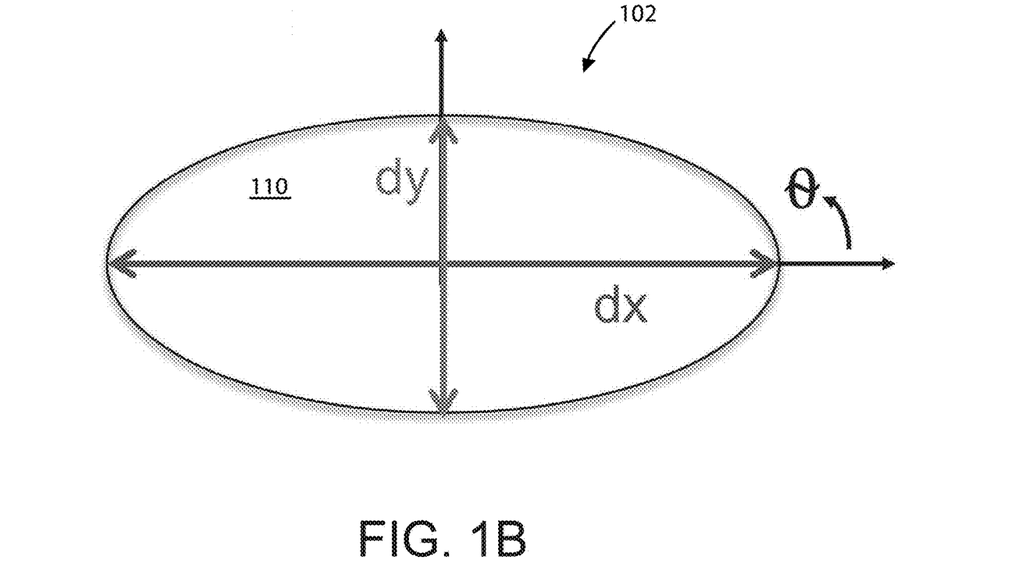

FIG. 1A is a simplified diagram illustrating a side "sandwich" view of an elliptical-shaped resonator according to an example of the present invention. As shown, device 101 includes a top metal plate 110 and bottom metal plate 120 that sandwich a piezoelectric layer 130. FIG. 1B is a simplified diagram illustrating a top view of the same elliptical-shaped resonator according an example of the present invention. Here, device 102 only shows the top metal plate 110, but the previously discussed measurements of the horizontal diameter (dx), vertical diameter (dy), and angle theta (θ) are shown in reference to the top metal plate 110.

Figure 2:
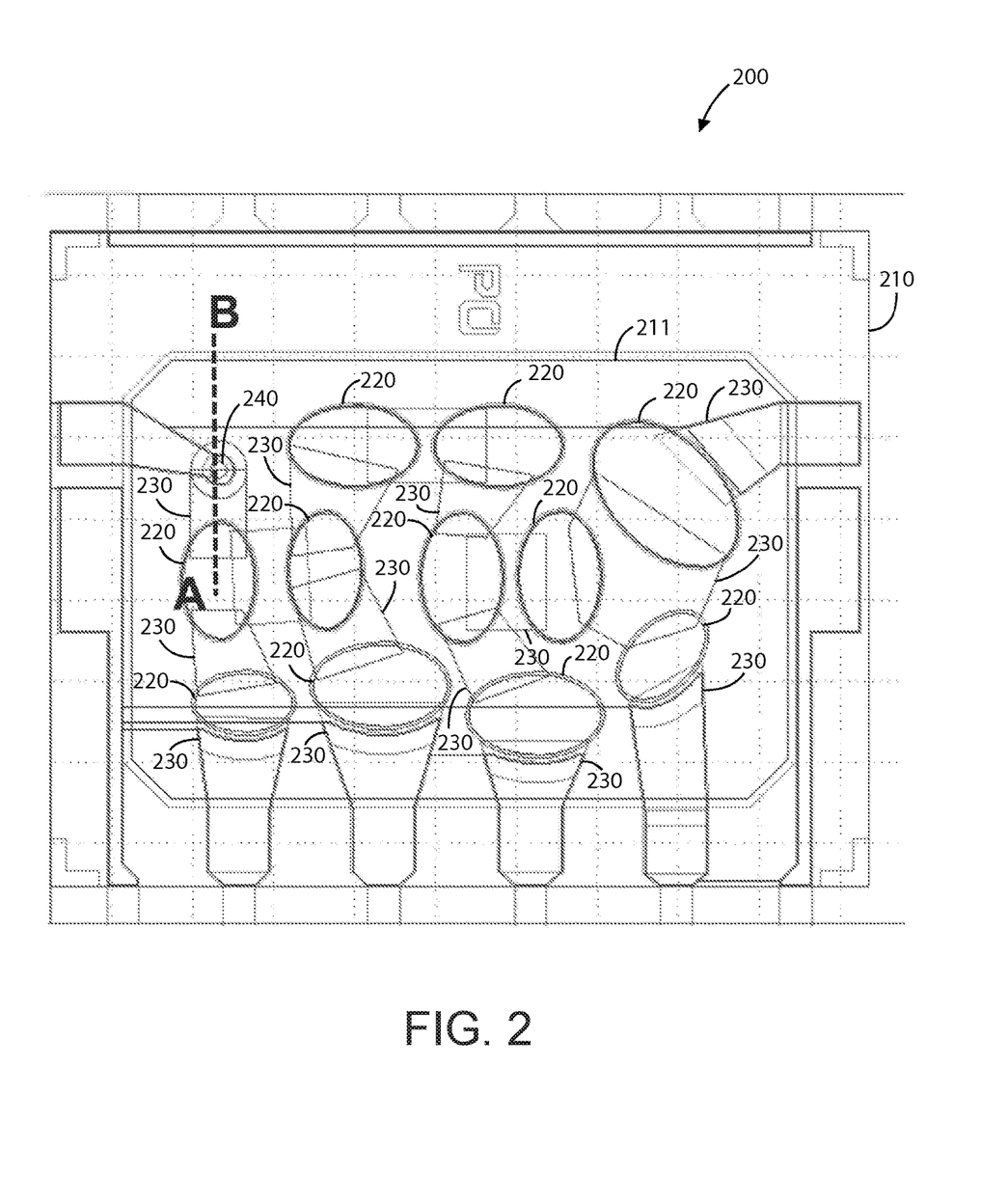
FIG. 2 is a simplified diagram illustrating an RF filter circuit device using several elliptical-shaped resonators according to various examples of the present invention.

FIG. 2 is a simplified diagram illustrating an RF filter circuit device using several elliptical-shaped resonators according to various examples of the present invention. As shown, device 200 includes several elliptical-shaped resonators 220 configured on a circuit die 210. In a specific example, the circuit die (or substrate) is selected from a silicon substrate, a sapphire substrate, silicon carbide substrate, a GaN bulk substrate, a GaN template, an AlN bulk, an AlN template, $Al_xGa_{1-x}N$ templates, engineered substrates such as silicon on insulator (SOI), and polycrystalline AlN templates. These resonators 220 can be connected by metal interconnects 230 with or without micro-vias 240 to each other or to connections off-chip. In this example, a dielectric passivation layer 211-is formed overlying the circuit die 210, which can be silicon dioxide ($SiO_2$), silicon nitride (SiN), aluminum nitride (AlN), or aluminum oxide (AlO), or the like. The use of $SiO_2$ can improve temperature drift in the RF filter circuit. Those of ordinary skill in the art will recognize other variations, modifications, and alternatives.

Figure 3A:
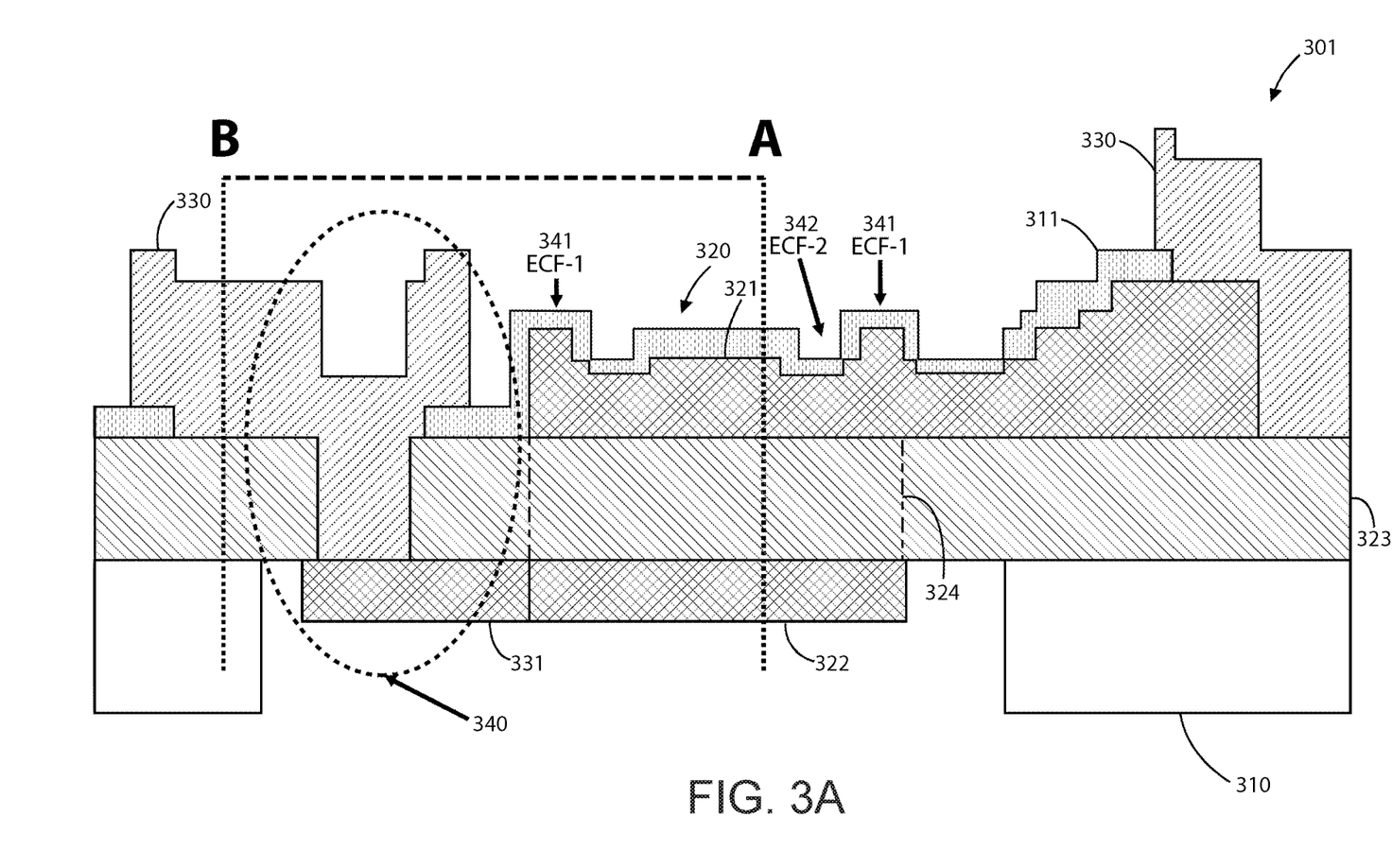
FIG. 3A is a simplified diagram illustrating a cross-sectional view of the RF filter circuit of FIG. 2 along the A-B reference line according to an example of the present invention.

FIG. 3A is a simplified diagram illustrating a cross-sectional view of the RF filter circuit of FIG. 2 along the A-B reference line according to an example of the present invention. As shown, device 301 includes an elliptical-shaped resonator device 320 overlying a substrate 310, which can include a silicon carbide (SiC) material or the like, and a dielectric passivation layer 311, which can include $SiO_2$ or the like. The resonator device 320 includes a top metal plate (top electrode) 321 and a bottom metal plate (bottom electrode) 322 sandwiching a piezoelectric layer 323, which can include an aluminum nitride (AlN) material or the like. Region 324 of the piezoelectric layer 323 shows the portion that is sandwiched between the top and bottom electrodes 321, 322. In a specific example, the piezoelectric layer includes materials or alloys having at least one of the following: AlN, AlGaN, GaN, InN, InGaN, AlInN, AlInGaN, ScAlN, ScGaN, AlScYN, and BN. A micro-via 340 is configured adjacent to this resonator 320, with a backside metal interconnect 331, which can include a molybdenum material or the like, coupling the micro-via 340 to the bottom metal plate 322. Metal interconnects 330 can be coupled to the top electrode 321 or to the bottom electrode 322 through the micro-via 340 and the backside metal interconnect 331.

In a specific example, the resonator 320 also includes two types of energy confinement features (ECFs), ECF-1 341 and ECF-2 342. The ECF-1 341 include one or more pillar structures on the top metal plate surface, while the ECF-2 342 include one or more cavity regions within the top metal electrode surface. These ECF structures can also be formed on the bottom metal plate as well. In a specific example, the bottom metal plate, top metal plate, and the ECF structures can include molybdenum (Mo), ruthenium (Ru), Aluminum Copper (AlCu), or tungsten (W), or the like. Of course, there can be other variations, modifications, and alternatives.

Figure 3B:
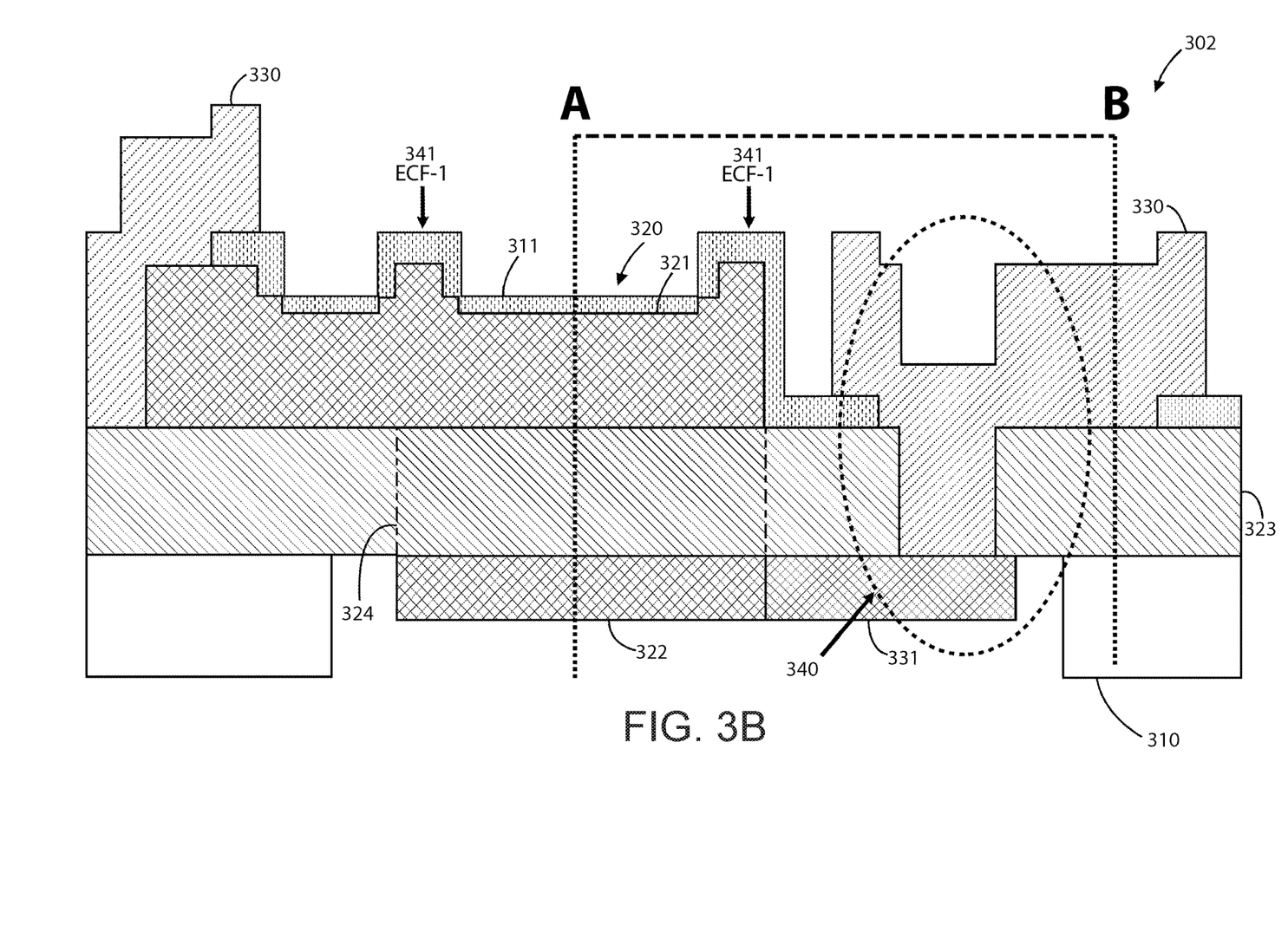
FIG. 3B is a simplified diagram illustrating a cross-sectional view of the RF filter circuit of FIG. 2 along the A-B reference line according to an example of the present invention.

FIG. 3B is a simplified diagram illustrating a cross-sectional view of the RF filter circuit of FIG. 2 along the A-B reference line according to an example of the present invention. As shown, device 302 is similar to device 301 except that only ECF-1 structures are present without any ECF-2 structures. The remaining elements follow the same reference number scheme as those in FIG. 3A.

Figure 4:
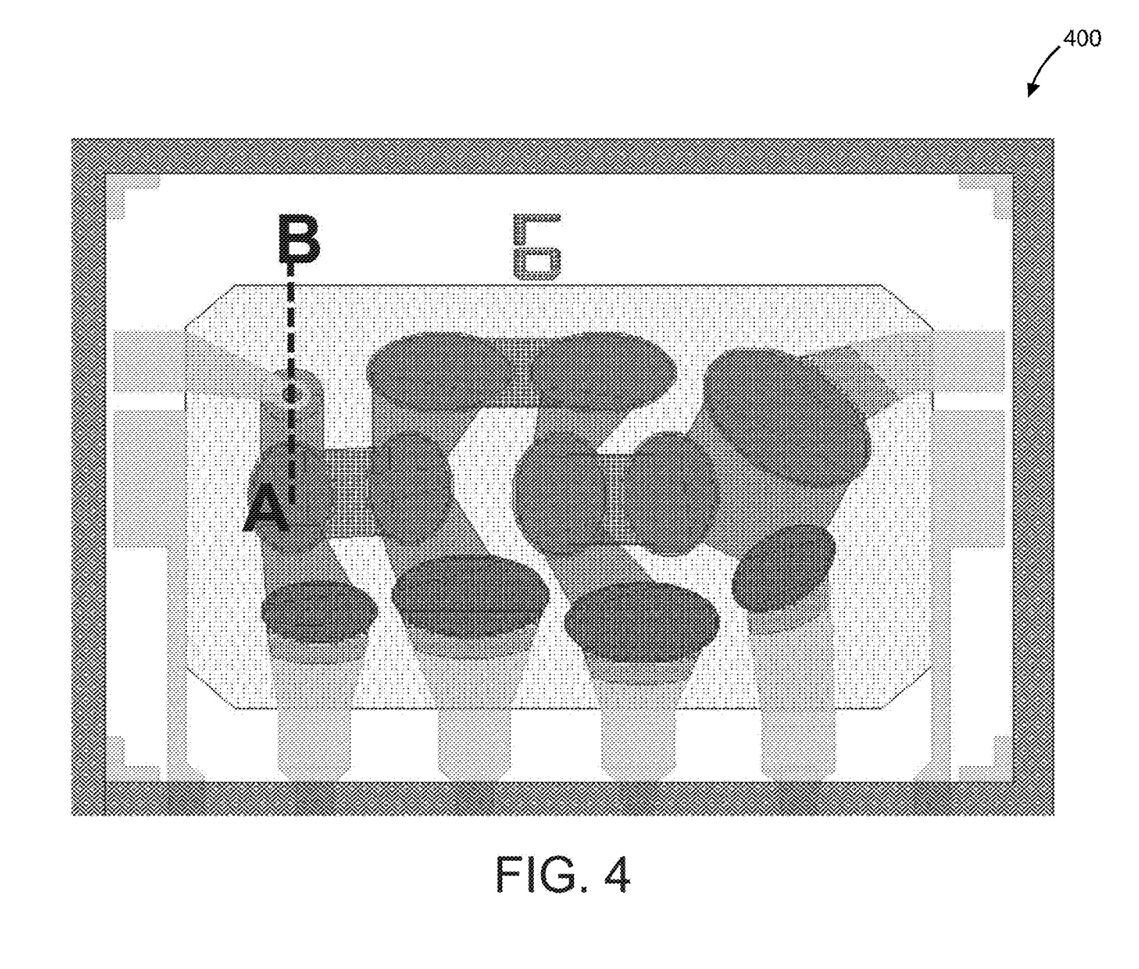
FIG. 4 is a computer-aided design (CAD) layout of an RF filter circuit device using elliptical-shaped resonators according to an example of the present invention.
Figure 5:
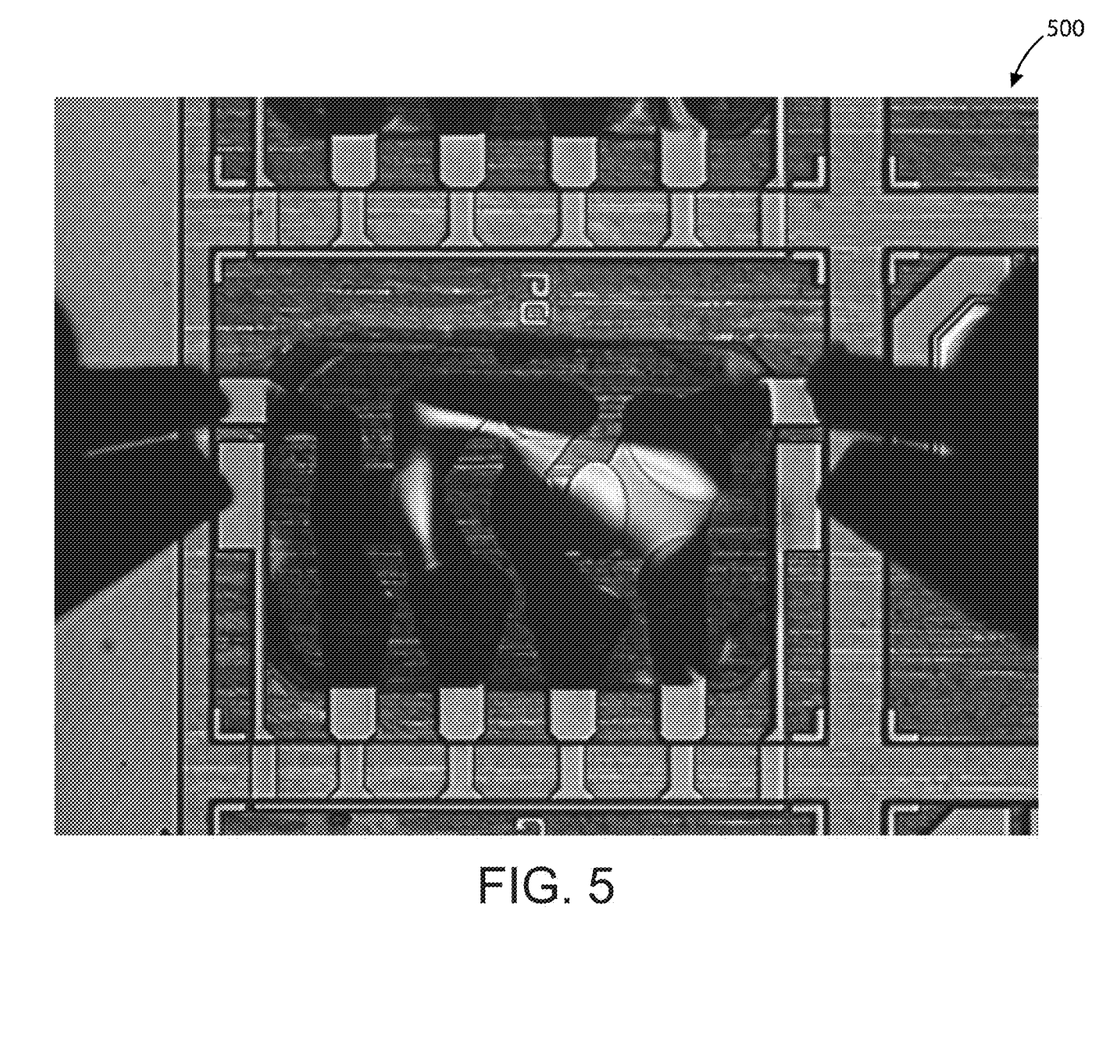
FIG. 5 is an image of a physical implementation of an RF filter circuit using elliptical-shaped resonators according to an example of the present invention.

FIG. 4 is a computer-aided design (CAD) layout of an RF filter circuit device using elliptical-shaped resonators according to an example of the present invention. Image 400 shows a layout similar to that of FIG. 2. FIG. 5 is an image of a physical implementation of an RF filter circuit using elliptical-shaped resonators according to an example of the present invention. Image 500 is configured in the same orientation as FIG. 4 for comparison purposes.

Figure 6:
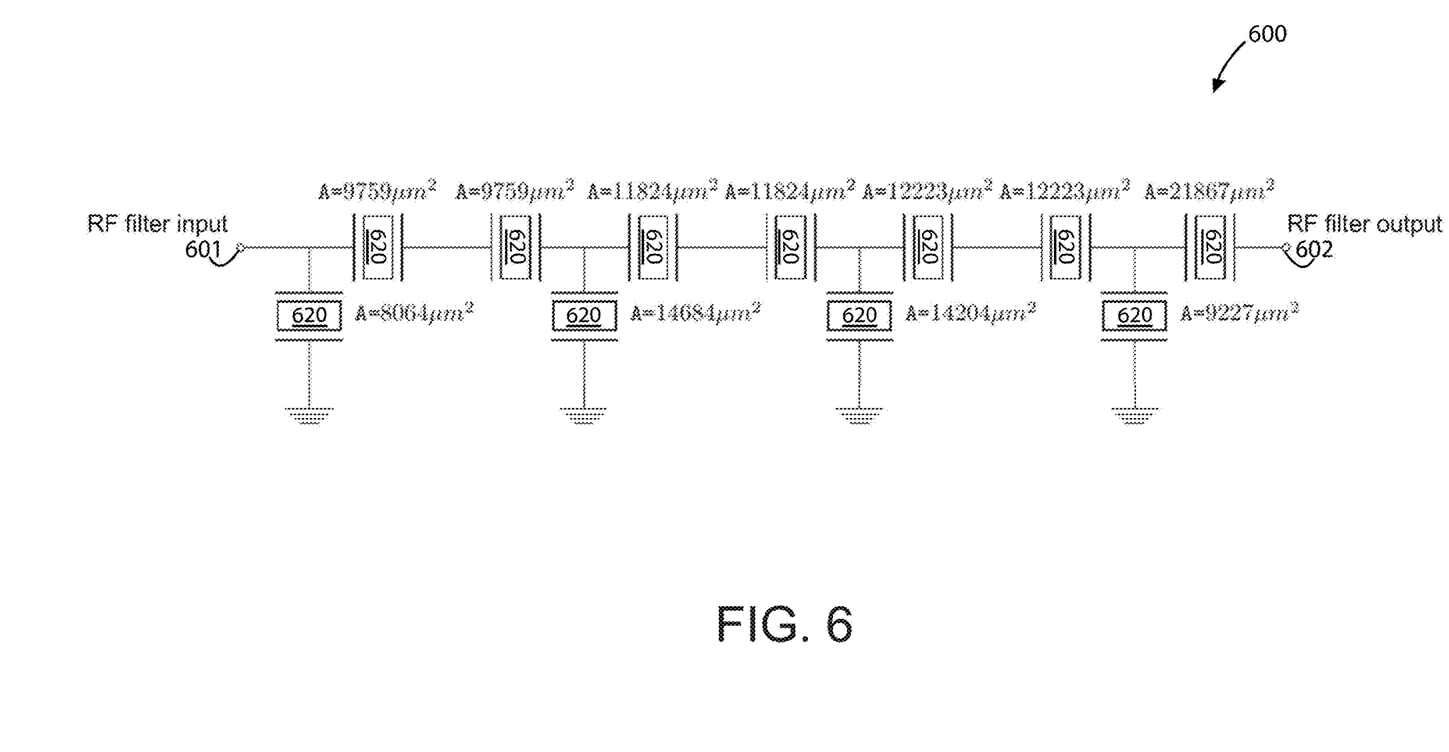
FIG. 6 is a simplified circuit diagram illustrating an elliptical-shaped resonator configured RF filter circuit device according to an example of the present invention.

FIG. 6 is a simplified circuit diagram illustrating an elliptical-shaped resonator configured RF filter circuit device according to an example of the present invention. As shown, device 600 includes an RF filter input 601 and an RF filter output 602 with elliptical-shaped resonators 620 configured in between. In a specific example, the RF filter includes 11 such resonators, with seven resonators in series between the input and output and four resonators connected to intersections of the series configurations and ground. Of course, there can be other variations, modifications, and alternatives.

Figure 7A:
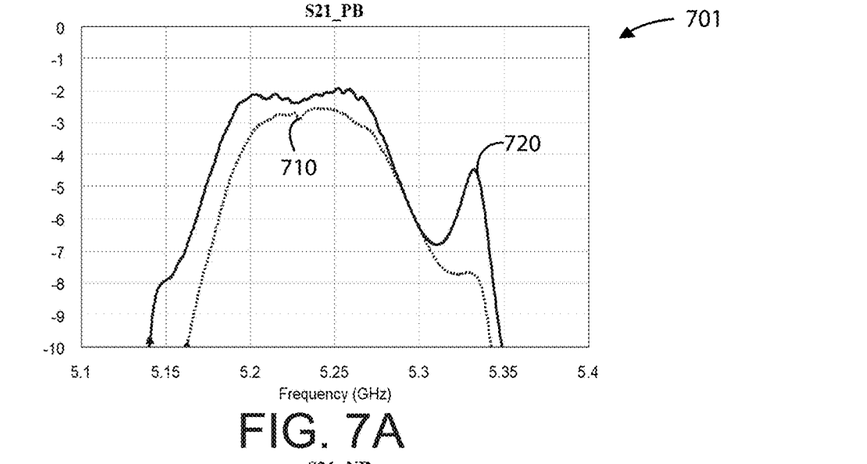
FIG. 7A is a graph comparing the insertion loss of a filter passband for a conventional polygon-shaped resonator to one for an elliptical-shaped resonator (R=1.61) according to an example of the present invention.

FIG. 7A is a graph 701 comparing the insertion loss of a filter passband for a conventional polygon-shaped resonator to one for an elliptical-shaped resonator (R=1.61) according to an example of the present invention. The results for the conventional polygon-shaped resonator are shown by plot 710, while the results for the elliptical-shaped resonator are shown by plot 720.

Figure 7B:
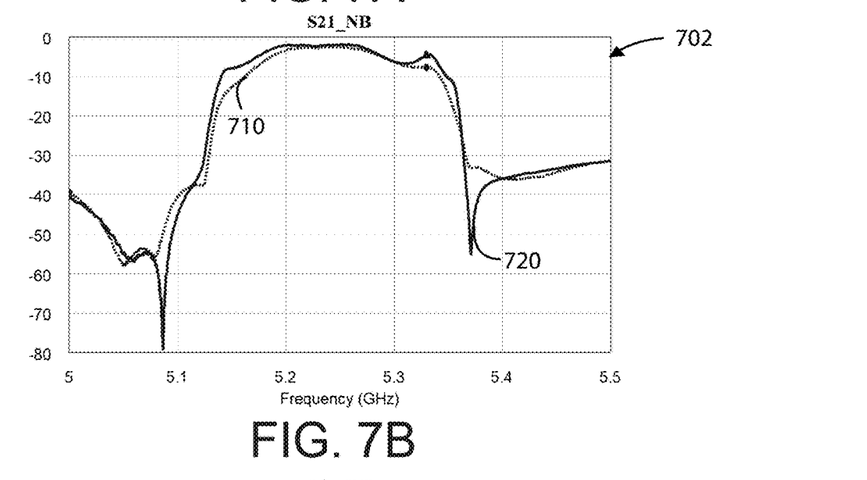
FIG. 7B is a graph comparing the insertion loss of a filter narrow band spectrum for a conventional polygon-shaped resonator to one for an elliptical-shaped resonator (R=1.61) according to an example of the present invention.

FIG. 7B is a graph 702 comparing the insertion loss of a filter narrow band spectrum for a conventional polygon-shaped resonator to one for an elliptical-shaped resonator (R=1.61) according to an example of the present invention. The results for the conventional polygon-shaped resonator are shown by plot 710, while the results for the elliptical-shaped resonator are shown by plot 720.

Figure 7C:
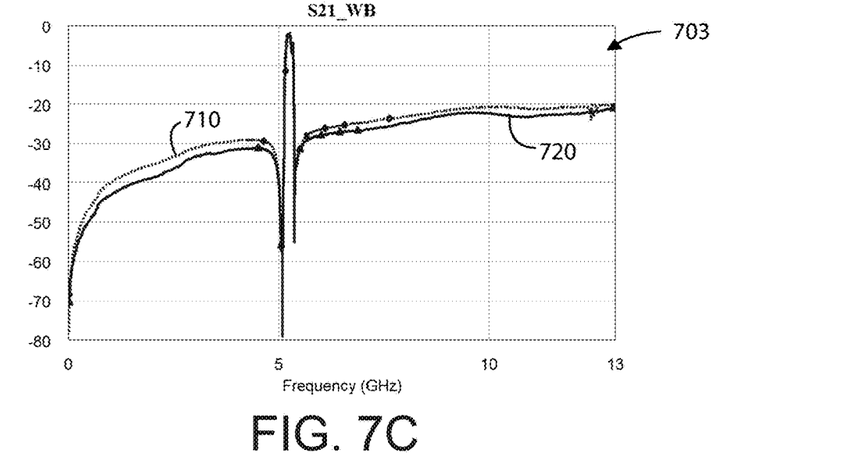
FIG. 7C is a graph comparing the insertion loss of a filter wide band spectrum for a conventional polygon-shaped resonator to one for an elliptical-shaped resonator (R=1.61) according to an example of the present invention.

FIG. 7C is a graph 703 comparing the insertion loss of a filter wide band spectrum for a conventional polygon-shaped resonator to one for an elliptical-shaped resonator (R=1.61) according to an example of the present invention. The results for the conventional polygon-shaped resonator are shown by plot 710, while the results for the elliptical-shaped resonator are shown by plot 720.

Figure 8A:
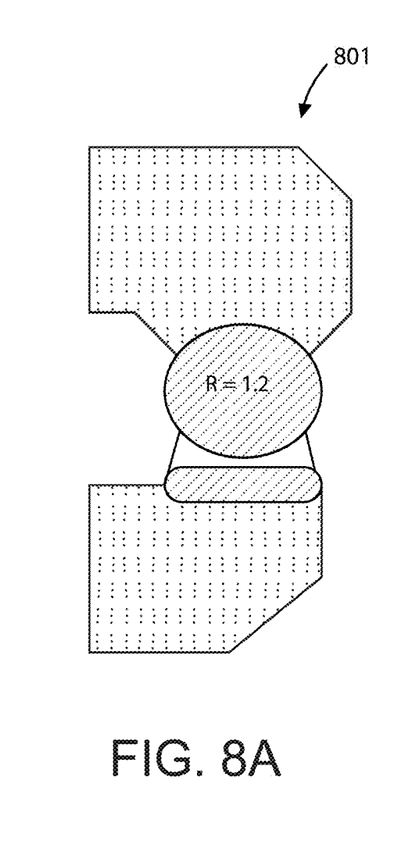
FIG. 8A-8D is are simplified diagrams illustrating elliptical-shaped resonators configured with various ratios of R.
Figure 8B:
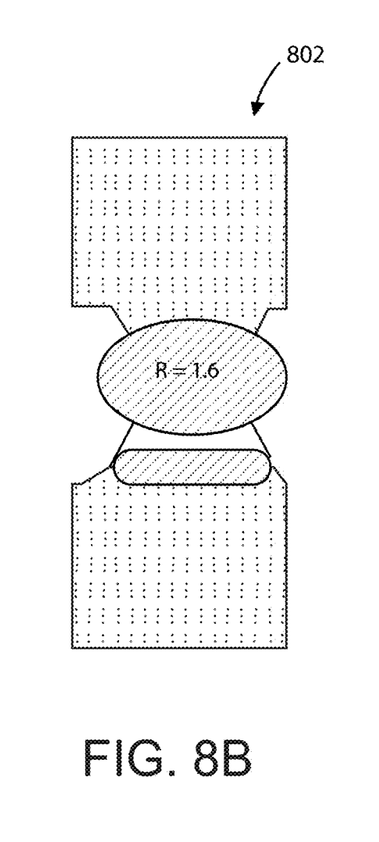
Figure 8C:
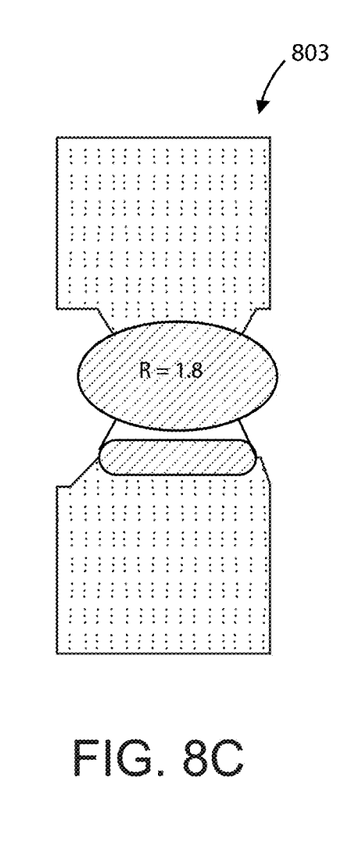
Figure 8D:
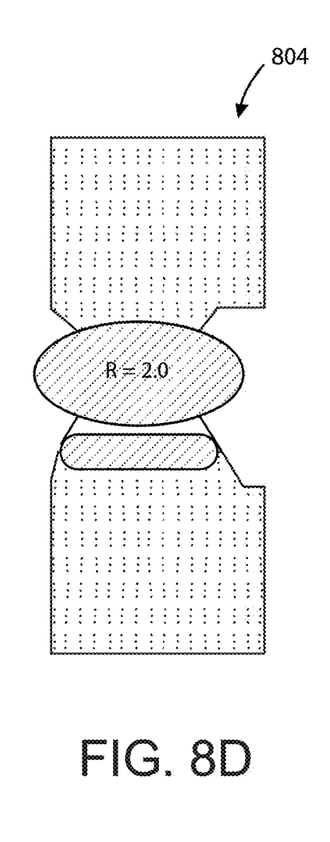

FIG. 8A-8D is are simplified diagrams illustrating elliptical-shaped resonators configured with various ratios of R. FIG. 8A illustrates a device 801 having an ellipse ratio of R=1.2. FIG. 8B illustrates a device 802 having an ellipse ratio of R=1.6. FIGS. 8C and 8D illustrate devices 803 and 804, which have ellipse ratios of R=1.8 and R=2.0, respectively.

Examples of the present invention take advantage of the fact that the shape of the BAW resonator determines the overall performance. Lateral mode noise reduces as the overall symmetry of the shape decreases, i.e., an elliptical shape shows weaker lateral mode noise than circular shapes. Weak vertical amplitude of acoustic wave in corners of quadrilateral or pentagon shapes reduces the coupling coefficient of the resonator; thus, an elliptical-shaped resonator eliminates the corners to allow a higher coupling coefficient. Further, the ratio of area-to-edge affects the quality factor of the resonator as the acoustic wave radiates outside of the resonator along the edge. Since an ellipse has a shorter edge for a given area compared to a quadrilateral, or other polygonal shape, an elliptical-shaped resonator can exhibit a higher quality factor as well.

In a specific example, an elliptical-shaped resonator with a specific aspect ratio of R=1.6 exhibits a better quality factor near the anti-resonance frequency ($Q_p$). The date from BAW resonators with the resonance frequency around 5 GHz shows a higher $Q_p$ when the aspect ratio of the ellipse is 1.6. The coupling coefficient for an elliptical-shaped resonator with a ratio of 1.6 is slightly less than an that of an elliptical-shaped resonator with the ratio of 1.2, but the overall figure of merit is higher with R=1.6. The graphs and table of FIGS. 9A-9C summarize these results.

Figure 9A:
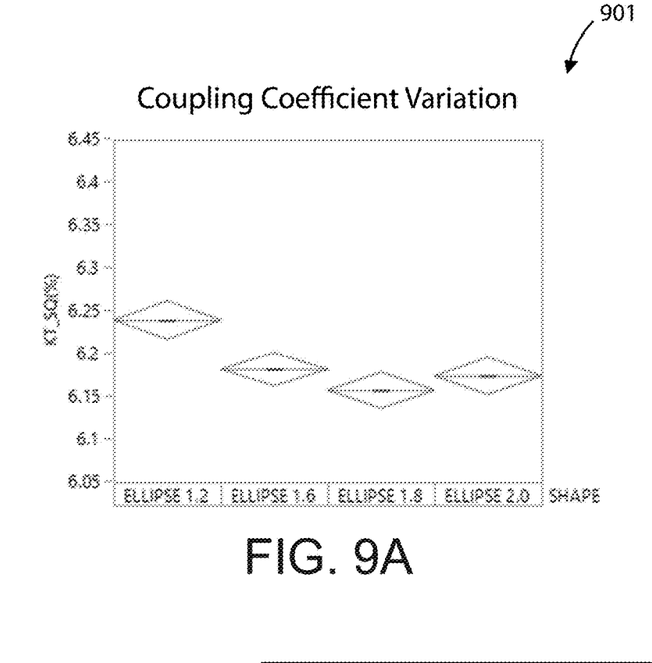
FIGS. 9A and 9B are graphs comparing the coupling coefficient and quality factor, respectively, between a conventional polygon-shaped resonator and an elliptical-shaped resonator according to an example of the present invention.
Figure 9B:
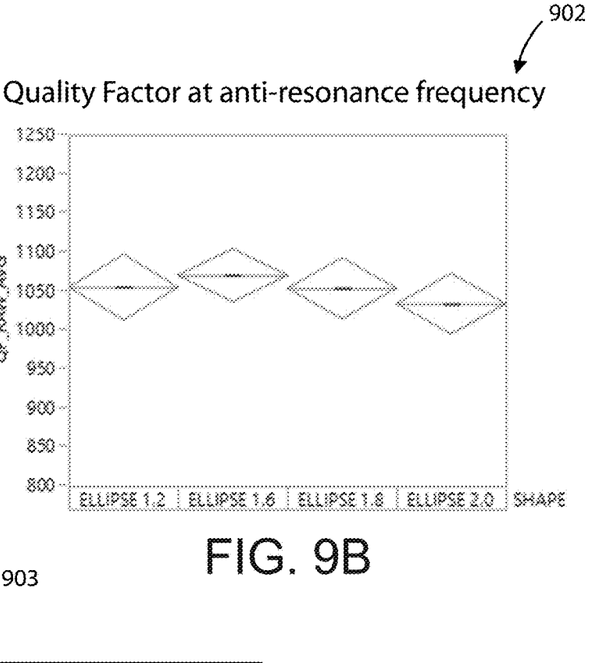
Figure 9C:
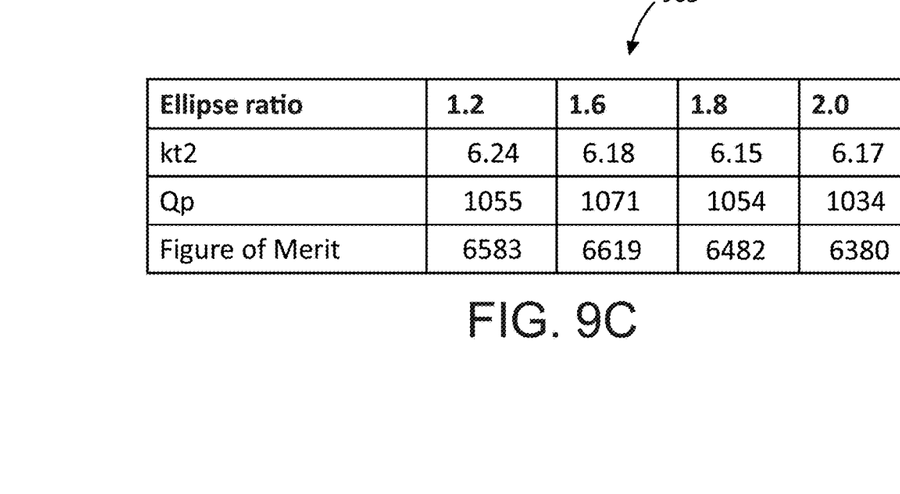
FIG. 9C is a table summarizing the results from the graphs shown in FIGS. 9A and 9B.

FIG. 9A is a graph 901 comparing the coupling coefficient variation for the elliptical-shaped resonators shown in FIG. 8. As shown in graph 901, the resonator with a ratio of 1.2 starts at the highest coupling coefficient. The value of this coefficient then falls as the ratio reaches 1.8, but rises again at a ratio of 2.0. FIG. 9B is a graph 902 comparing the quality factor for the elliptical-shaped resonators shown in FIG. 8. As shown in graph 902, the quality factor increases with the ratio as the ratio increases from 1.2 to 1.6, but then falls as the ratio descends to 1.8 and 2.0. FIG. 9C is a table 903 summarizing the results of the graphs 901, 902 from FIGS. 9A and 9B. Although the coupling coefficient variation was higher with an ellipse ratio of 1.2, the overall figure of merit was the highest at R=1.6 (about 1.60 to about 1.61).

One or more benefits are achieved over pre-existing techniques using the invention. In particular, the present device can be manufactured in a relatively simple and cost effective manner while using conventional materials and/or methods according to one of ordinary skill in the art. Using the present method, one can create an improved bulk acoustic wave resonator (BAWR) having equivalent or improved insertion loss compared to conventional polygon-shaped resonators. Such filters or resonators can be implemented in an RF filter device, an RF filter system, or the like. Depending upon the embodiment, one or more of these benefits may be achieved. Of course, there can be other variations, modifications, and alternatives.

While the above is a full description of the specific embodiments, various modifications, alternative constructions and equivalents may be used. As an example, the packaged device can include any combination of elements described above, as well as outside of the present specification. Therefore, the above description and illustrations should not be taken as limiting the scope of the present invention which is defined by the appended claims.

What is claimed is:

1. An RF filter circuit device, the device comprising:
a substrate member;
a dielectric passivation layer overlying the substrate member;
eleven elliptical-shaped resonator devices overlying the substrate member and configured underlying the dielectric passivation layer, each of the elliptical shaped resonators comprising
a bottom metal plate;
a piezoelectric layer overlying the bottom metal plate; and
a top metal plate overlying the piezoelectric layer;
wherein the top metal plate, the piezoelectric layer, and the bottom metal plate are characterized by an elliptical shape having a horizontal diameter (dx) and a vertical diameter (dy), which can be represented as ellipse ratio R=dx/dy; and
wherein seven of the elliptical-shaped resonator devices are configured in a series configuration; and wherein four of the elliptical-shaped resonator devices are configured between a junction of the series configuration and ground, the junctions being before the series configuration, after the second resonator in the series configuration, after the fourth resonator in the series configuration, and after the sixth resonator in the series configuration.

2. The device of claim 1 wherein the ellipse ratio R ranges from about 1.20 to about 2.00.

3. The device of claim 1 further comprising one or more pillar-type energy confinement features (ECFs) coupled to the top metal plate or the bottom metal plate;
wherein the one or more pillar-type ECFs comprises a dielectric material, a metal material, or a combination of dielectric and metal materials.

4. The device of claim 1 further comprising one or more cavity-type energy confinement features (ECFs) configured within the top metal plate or the bottom metal plate.

5. The device of claim 1 wherein the piezoelectric layer includes materials or alloys having at least one of the following: AlN, AlGaN, GaN, InN, InGaN, AlInN, AlInGaN, ScAlN, ScGaN, AlScYN, and BN.

* * * * *